United States Patent [19]

Sasaki et al.

[11] Patent Number: 5,546,489
[45] Date of Patent: Aug. 13, 1996

[54] OPTICAL LINK APPARATUS

[75] Inventors: Goro Sasaki; Hiroshi Yano; Sosaku Sawada; Kentaro Doguchi, all of Yokohama, Japan

[73] Assignee: Sumitomo Electric Industries, Ltd., Osaka, Japan

[21] Appl. No.: 520,007

[22] Filed: Aug. 28, 1995

Related U.S. Application Data

[63] Continuation of Ser. No. 280,859, Jul. 26, 1994, abandoned.

[30] Foreign Application Priority Data

Aug. 2, 1993 [JP] Japan .................................. 5-191425

[51] Int. Cl.⁶ ........................................................ G02B 6/36
[52] U.S. Cl. ....................................... 385/88; 385/14
[58] Field of Search ............................. 385/14, 15, 31, 385/49, 70, 73, 88, 89, 92, 94, 139

[56] References Cited

U.S. PATENT DOCUMENTS

| | | | |
|---|---|---|---|
| 4,911,519 | 3/1990 | Burton et al. | 385/14 |
| 4,930,857 | 6/1990 | Acarlar | 385/88 |
| 5,123,066 | 6/1992 | Acarlar | 385/14 |
| 5,127,071 | 6/1992 | Go | 385/73 |
| 5,276,754 | 1/1994 | Blair et al. | 385/88 |
| 5,325,454 | 6/1994 | Rittle et al. | 385/76 |
| 5,345,524 | 9/1994 | Lebby et al. | 385/89 X |
| 5,345,530 | 9/1994 | Lebby et al. | 385/88 |
| 5,353,364 | 10/1994 | Kurashima | 385/88 |
| 5,361,318 | 11/1994 | Go et al. | 385/89 |
| 5,416,871 | 5/1995 | Takahashi et al. | 385/89 X |

FOREIGN PATENT DOCUMENTS 4-329504  11/1992  Japan .

OTHER PUBLICATIONS

E. Tokumitsu et al. "Reduction of the Surface Recombination Current in InGaAs/InP Pseudo–Heterojunction Bipolar Transistors Using a Thin InP Passivation Layer" *IEEE Electron Device Letters*, vol. 10, No. 12, pp. 585–587 (Dec. 1989).

S. Chandrasekhar et al. "A Monolithic 5 Gb/s p–i–n/HBT Intergrated Photoreceiver Circuit Realized from Chemical Beam Epitaxial Material" *IEEE Photonics Technology Letters*, vol. 3, No. 9, pp. 823–825 (Sep. 1991).

S. Chandrasekhar et al. "An InP/InGaAs p–i–n/HBT Monolithic Transimpedance Photoreceiver" *IEEE Photonics Technology*, vol. 2, No. 7, pp. 505–506 (Jul. 1990).

*Primary Examiner*—Akm E. Ullah
*Attorney, Agent, or Firm*—Beveridge, DeGrandi, Weilacher & Young LLP

[57] ABSTRACT

In an optical link apparatus of the present invention, a hybrid IC which is a main amplifier of a receiver circuit, and a hybrid IC which is a transmitter circuit are mounted on an island of a lead frame. An OEIC in which electronic devices and a light receiving device which constitute a preamplifier of the receiver circuit are integrated is housed in a light receiving device unit. A light emitting device is housed in a light emitting device unit. Sleeves which are optical link components are installed at the light receiving device unit and the light emitting device unit, and one ends of the sleeves are protruded from a plastic molding to the outside. As wires are connected to lead pins, the hybrid ICs are electrically connected with the light receiving device unit and the light emitting device unit. The lead pins, the hybrid ICs, the light receiving device unit, the light emitting device unit, and the sleeves are integrally sealed by a plastic molding which is superior in productivity and processability. Therefore, the optical link apparatus which is small and superior in productivity can be achieved.

13 Claims, 9 Drawing Sheets

COMPOSITION OF EACH LAYER IS THE SAME AS Fig. 7

OPTICAL LINK APPARATUS

This application is a continuation of application Ser. No. 08/280,859, filed Jul. 26, 1994 (now abandoned), which application is entirely incorporated herein by reference.

BACKGROUND OF THE INVENTION

1. Field of the Invention

The present invention relates to an optical link apparatus to which an optical fiber cable is coupled for transmitting data.

2. Related Background Art

An optical link apparatus comprises either a light receiver unit or a light transmitter unit, or comprises both of them. The optical link apparatus includes lead pins and a link unit (sleeve) which protrudes from a package and which is coupled to an optical fiber cable. A light receiving device or a light emitting device is fixed in the optical link unit. As a ferrule which holds an optical fiber is inserted into a hole of the optical link unit, the optical coupling between the light receiving device or the light emitting device and the optical fiber can be achieved.

A metal package and a ceramic package have been used as packages for optical link apparatus; however, there are problems of productivity, processability and cost. As the countermeasure for these problems, an optical link apparatus to which a plastic molding technique, which is used in mass production LSI and which is superior in productivity and processability, is utilized has been developed.

As an optical link apparatus which is molded by a plastic, the structure of an optical link apparatus disclosed in "Japanese Patent Laid-Open No. HEI 4-329504 (329504/1992)" is shown in FIG. 1. A flexible substrate (lead frame) 40 is bent into L-shape and fixed on an island 6b which is for mounting a substrate. Electronic circuit components constituting a transmitter circuit and a receiver circuit are mounted on flat parts 40a and 40b of the flexible substrate 40, respectively. Further, a light emitting device and a light receiving device are mounted on vertical parts 40c and 40d, respectively. A transparent resin part 41 is formed on an external surface of each vertical plane 40c and 40d so as to oppose to a sleeve 4. Next, these devices and units are integrally sealed by a plastic molding. Thereafter, the unnecessary parts (e.g., a support part 6d, a separation part 6e, and others) are cut off, and the lead pins 6a are bent. Then, the optical link apparatus comprising an optical transmitter unit and an optical receiver unit is completed.

An optoelectronic integrated circuit (hereinafter called OEIC) in which an optical device and an electronic device are monolithically integrated on a semiconductor substrate has been researched and developed because compactness and high performance can be achieved. In particular, an OEIC in which a high electron mobility transistor (hereinafter called HEMT) which is a high speed electronic device or a heterojunction bipolar transistor (hereinafter called HBT) is fabricated on an indium phosphide (InP) substrate has been drawing the attention as a device for longwavelength optical fiber communications.

For example, an optoelectronic integrated circuit is disclosed in "An InP/InGaAs p-i-n/HBT Monolithic Transimpedance Photoreceiver, IEEE PHOTONICS TECHNOLOGY LETTERS, VOL. 2, No. 7, JULY 1990". In this OEIC, an HBT is used as a transistor.

SUMMARY OF THE INVENTION

It is an object of the present invention to provide a compact optical link apparatus with excellent productivity.

An optical link apparatus of the first aspect of the present invention comprises a link unit to be coupled to an optical fiber cable, a light receiving device for converting an optical signal entered from the optical fiber into an electrical signal, and a receiver circuit for processing the electrical signal from the light receiving device, and the optical link apparatus is integrally molded with a plastic so that one end of the link unit is exposed to the outside. The light receiving device, and a bipolar transistor constituting at least a part of the receiver circuit are integrated on the same semiconductor substrate and installed at one end of the optical link unit.

An optical link apparatus of the second aspect of the present invention comprises a link unit to be coupled to an optical fiber cable, a light emitting device for emitting an optical signal to the optical fiber cable, and a transmitter circuit for driving the light emitting device, and the optical link apparatus is integrally molded with a plastic so that one end of the link unit is exposed to the outside. The light emitting device, and a bipolar transistor constituting at least a part of the transmitter circuit are integrated on the same semiconductor substrate and installed at one end of the optical link unit.

Here, the semiconductor substrate can be made of InP.

Here, it is desirable that the bipolar transistor is a heterojunction bipolar transistor, and that the light receiving device is a pin photodiode.

The heterojunction bipolar transistor may comprise (1) a collector portion comprising a first semiconductor layer formed on the substrate and having a first conduction type, and a first electrode formed on a surface of the first semiconductor layer, (2) a base portion comprising a second semiconductor layer formed on the collector portion and having a second conduction type, and a second electrode formed on a surface of the second semiconductor layer, and (3) an emitter portion comprising a third semiconductor layer formed on a surface of the base portion opposing to a junction between the base portion and the collector portion and having the first conduction type, and a part of the third semiconductor layer on a first region of a surface of the base portion has a first thickness, and the third semiconductor layer on a second region of a surface region of the base portion, except the first region and the second electrode formed region has a thickness so as to be depleted under normal operation.

Further, it is preferable that the pin photodiode comprises semiconductor layers deposited on a substrate into a mesa shape.

Furthermore, it is preferable that the pn junction of the pin photodiode is homojunction, and that the heterojunction is not presented in the vicinity of the pn junction.

In the optical link apparatus of the present invention, the light emitting device or the light receiving device, and the bipolar transistor are integrated on the same semiconductor substrate and installed at one end of the optical link unit, and the optical link apparatus is molded with a plastic, so that the area of the lead frame can remarkably be made smaller. Since the plastic molding is superior in productivity and processability, the optical link apparatus which is small and superior in productivity can be achieved.

Further, it is preferable that a heterojunction bipolar transistor is used in an optoelectronic integrated circuit. This is because the inventors of the present application found that the heterojunction bipolar transistor was thermally stable.

In the case that the heterojunction bipolar transistor and the pin photodiode are used as a bipolar transistor and a light receiving device, respectively, because heat characteristics of both devices are stable, the characteristics of the optical link apparatus do not degrade even though it is stored at high temperature in a plastic molding process.

When a layer made of a semiconductor material of the emitter portion, which has a larger band gap than that of a semiconductor material of the base portion, is formed not only on the junction (intrinsic region) between the base portion and the emitter portion, but also on the region of the surface of the base portion other than the intrinsic region to a thickness which is thinner than the thickness at which the emitter portion is depleted under normal operation, the heterojunction bipolar transistor, of course, operates as the heterojunction bipolar transistor but has the small base leakage current.

Further, when the pin photodiode is formed into a mesa shape, light which enters almost perpendicularly on the region other than the light receiving region does not reach the depletion layer, so that the slow carriers do not generate.

Furthermore, when the heterojunction is not presented in the pn junction and its vicinity of the pin photodiode, the carrier accumulation which occurs in the case of the presence of the heterojunction does not occur.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1:
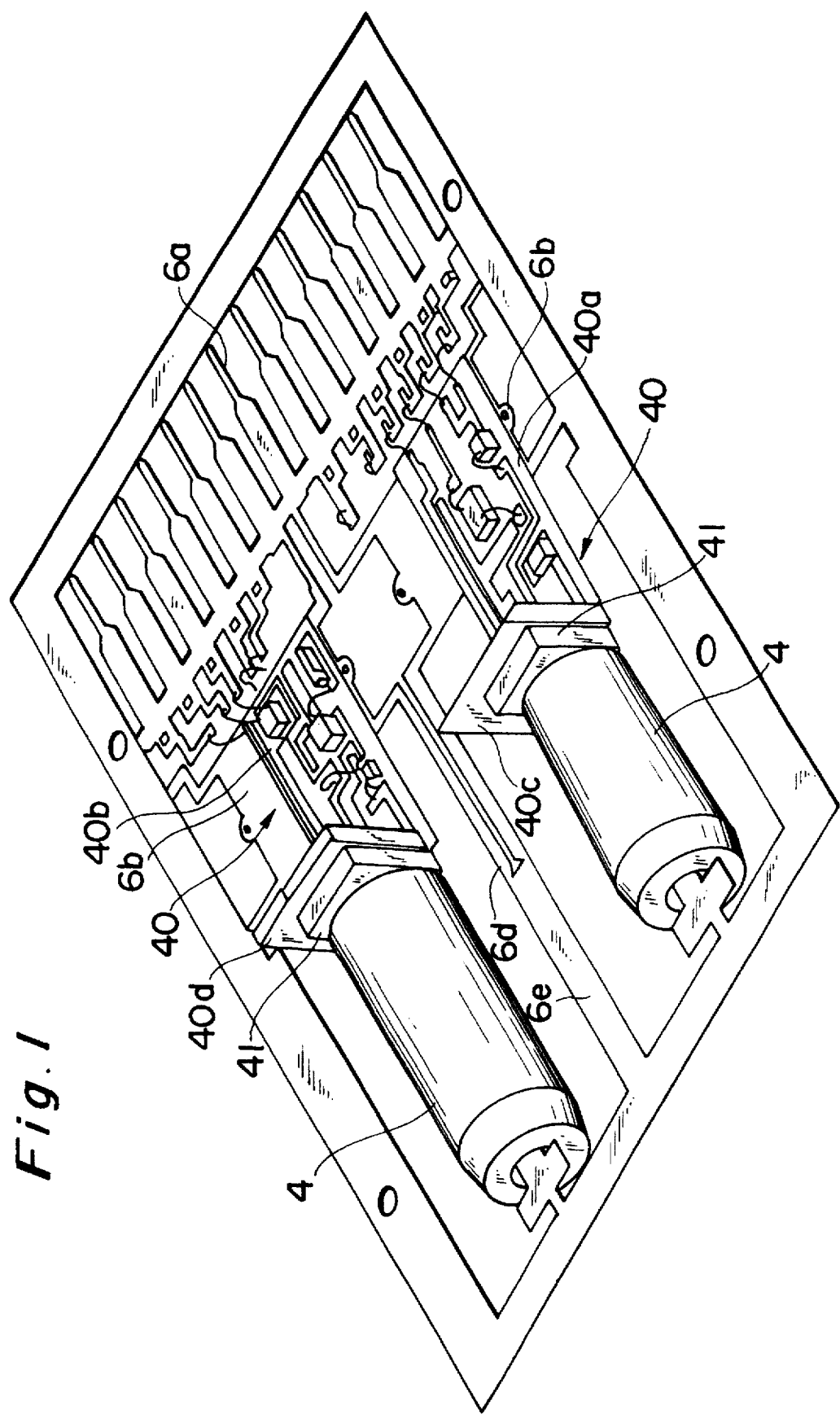
FIG. 1 is a perspective view showing the structure of a conventional optical link apparatus.

The embodiments of the present invention will be described hereunder with reference to the drawings. The same components are represented by the same reference numerals and the repetitive description on the same components is omitted.

Figure 2:
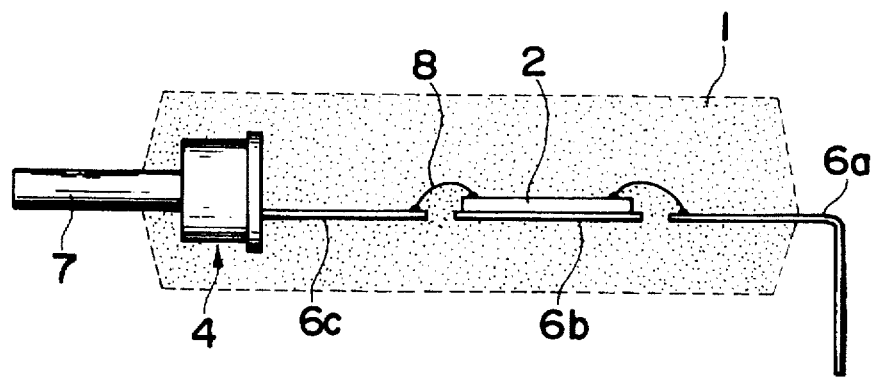
FIG. 2 is a sectional side elevation view showing the structure of an optical link apparatus of the embodiment according to the present invention.
Figure 3:
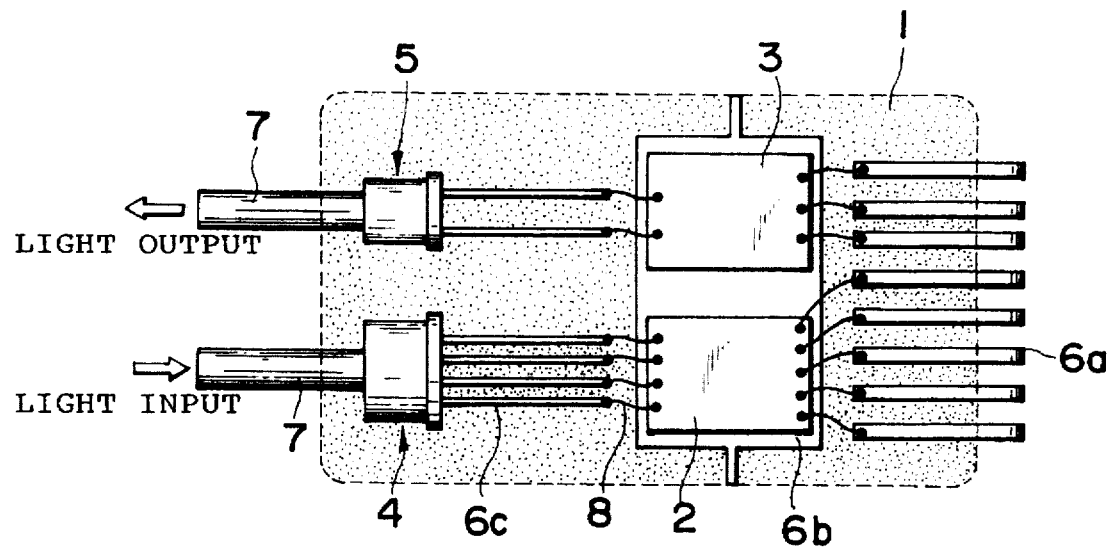
FIG. 3 is a top sectional view showing the structure of an optical link apparatus of the embodiment according to the present invention.

FIG. 2 shows a sectional side elevation view of the structure of an optical link apparatus of the embodiment, and FIG. 3 shows its top sectional view. A hybrid IC 2 which is a main amplifier of a receiver circuit, and a hybrid IC 3 which is a transmitter circuit are mounted on an island 6b of a lead frame. An OEIC in which electronic devices and a light receiving device which constitute a preamplifier of the receiver circuit are integrated is housed in a light receiving device unit 4. A light emitting device is housed in a light emitting device unit 5. Sleeves 7 which are optical link components are installed at the light receiving device unit 4 and the light emitting device unit 5, and one ends of the sleeves 7 are protruded from a plastic molding 1 to the outside. As wires 8 are connected to lead pins 6c, the hybrid ICs 2 and 3 are electrically connected with the light receiving device unit 4 and the light emitting device unit 5.

Each lead pin 6a has an inner lead and an outer lead which is protruded from the plastic molding 1 and which forms an external terminal of the optical link apparatus. The inner leads of the lead pins 6a are connected with pads of the hybrid ICs 2 and 3 through wires 8 to input and output electrical signals from and to the outside.

The lead pins 6a and 6c, the hybrid ICs 2 and 3, the light receiving device unit 4, the light emitting device unit 5, and the sleeves 7 are integrally sealed by the plastic molding 1.

Ferrules which hold optical fibers are inserted into the sleeves 7 protruding from the plastic molding 1 to receive and transmit optical signals. The light receiving device converts an optical signal entering from the optical fiber into an electrical signal, and this electrical signal is processed in the receiver circuit. That is, the electrical signal is processed in the preamplifier of the OEIC and thereafter processed in the main amplifier of the hybrid IC 2. The light emitting device which is driven by the transmitter circuit emits an optical signal to the optical fiber.

Figure 4:
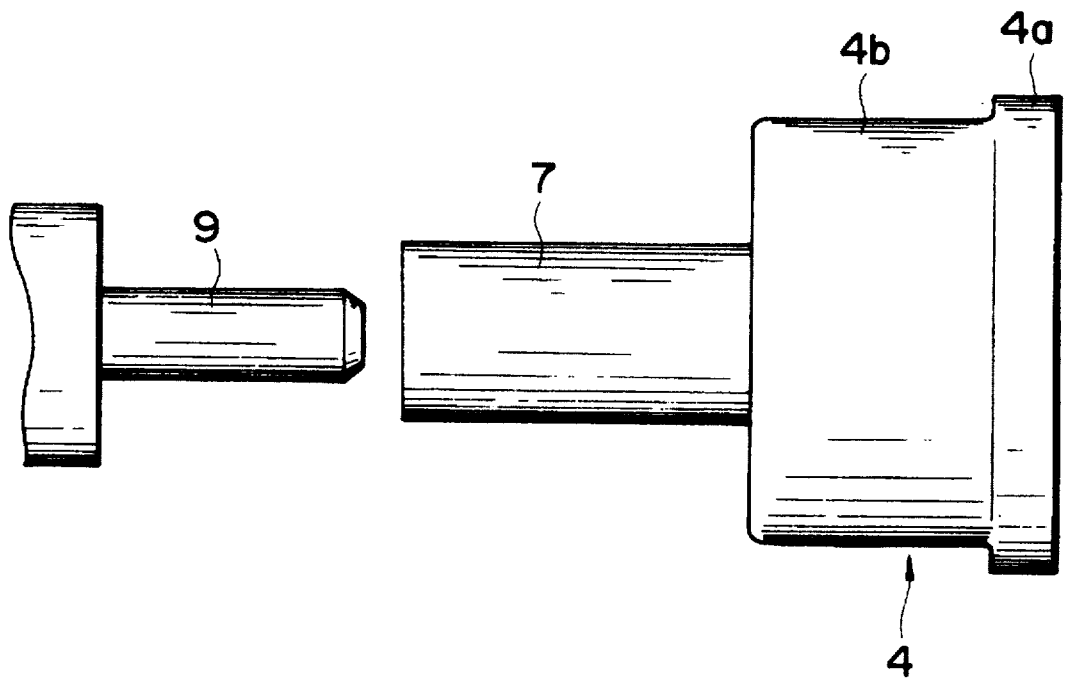
FIG. 4 is a sectional side elevation view showing a light receiving device unit, a sleeve, and a ferrule of an optical link apparatus of the embodiment.
Figure 5:
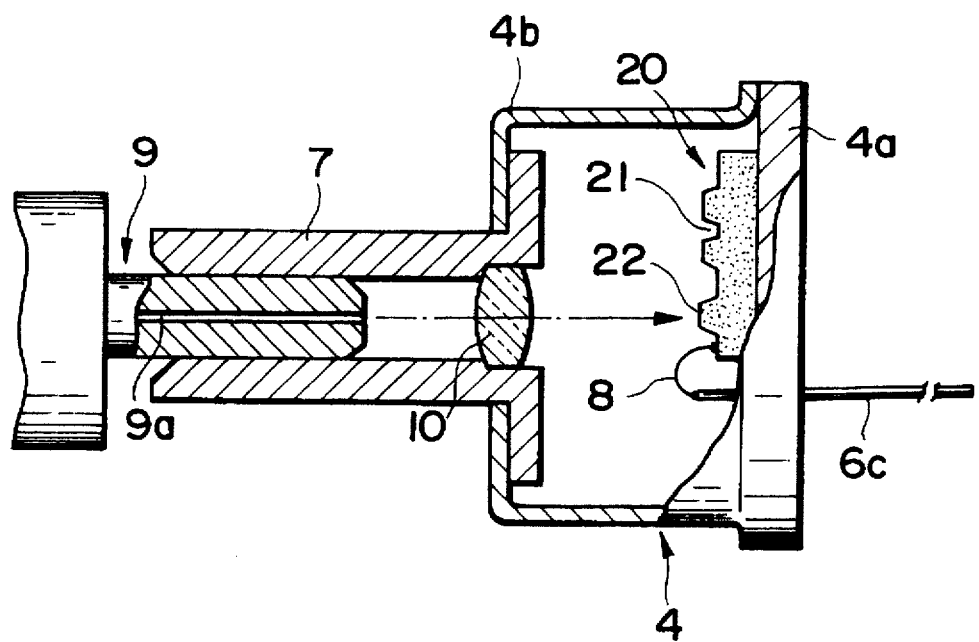
FIG. 5 is a sectional view showing a state in which a ferrule is inserted into a sleeve installed at a light receiving device unit.

FIG. 4 shows a sectional side elevation view of the light receiving device unit 4, the sleeve 7, and the ferrule 9, and FIG. 5 shows a sectional side elevation view of a state in which the ferrule 9 is inserted into the sleeve 7 installed at the light receiving device unit 4. The light receiving device unit 4 is constructed such that a package 4b is molded while a base plate 4a on which the OEIC 20 is mounted and the ferrule 7 are faced each other. The base plate 4a is installed perpendicular to the lead pin 6c which penetrates the base plate 4a. The OEIC 20 is mounted on the base plate 4a so that the pin photodiode 22 of the OEIC 20 and a lens 10 are faced each other. The OEIC 20 is connected to the lead pin 6c with the wire 8. The pin photodiode 22, a heterojunction bipolar transistor 21, and other devices are integrated in the OEIC 20.

The lens 10 is fixed in the sleeve 7, which is fixed by the package 4b, so as to be close enough to be optically coupled, and its optical axis is matched with that of the pin photodiode 22. The ferrule 9 holds the optical fiber 9a. As this ferrule 9 is inserted into the sleeve 7, the optical fiber 9a and the pin photodiode 22 are optically coupled.

Figure 6:
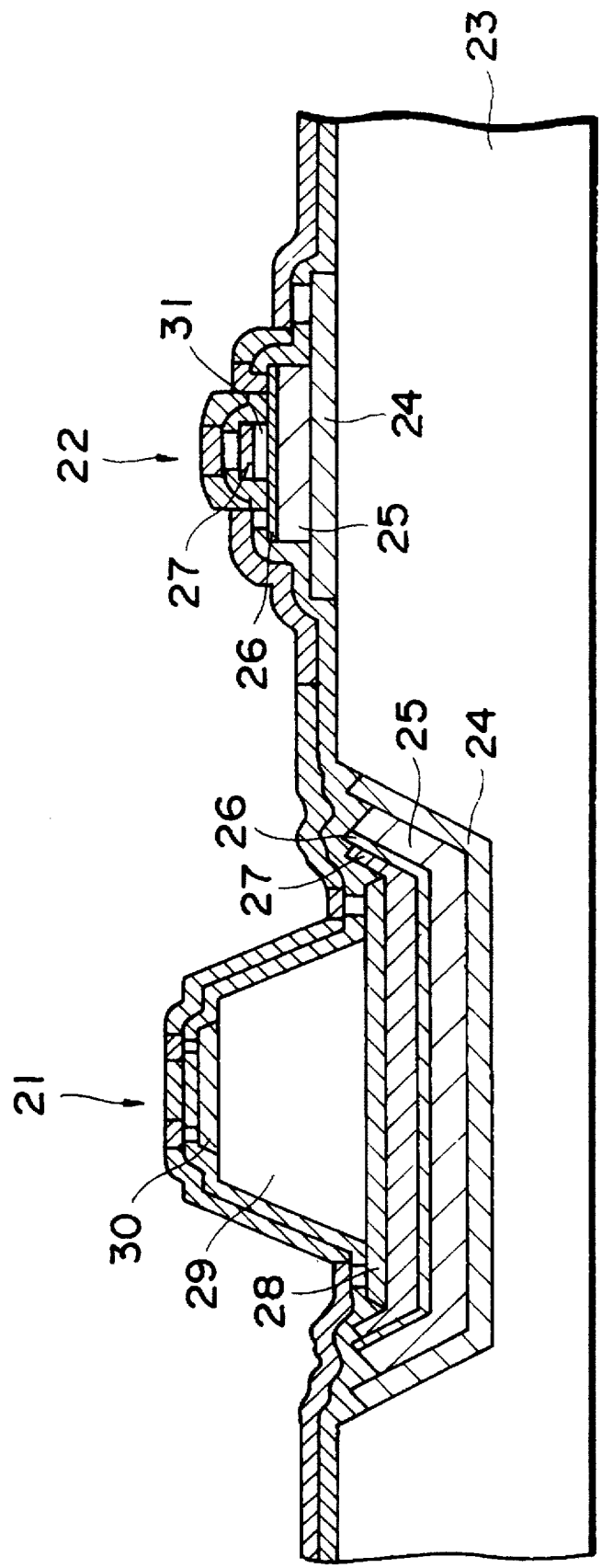
FIG. 6 is a sectional view showing an optoelectronic integrated circuit used in an optical link apparatus of the embodiment.

FIG. 6 shows a cross section of an HBT 21 and a pin photodiode 22 in the OEIC, which are used in the present embodiment. The pin photodiode 21 and the HBT 22 are fabricated with an indium phosphide substrate 23. First, a recess is formed on the indium phosphide substrate. Next, HBT layers comprising a sub-collector layer 24 (GainAs), a collector layer 25 (GainAs), a base layer 26 (GainAs), an emitter layer 31 (InP) and an emitter contact layer 27 (GainAs), and pin photodiode layers comprising a cathode layer 28 (InP), an absorption layer 29 (GainAs) and an anode layer 30 (GainAs) are grown in order by an OMVPE method. Note that the cathode layer 28 has the p-type conductivity, and that the absorption layer 29 has the weak n-type conductivity, and that the anode layer 30 has the p-type conductivity. The pn junction is junction between the absorption layer 29 and the anode layer 30. Next, a pin photodiode mesa and the HBT are etched, and the pin photodiode and the HBT are isolated. Thereafter, an SiN film which is an insulating layer is deposited, and electrodes and wiring are formed. An OEIC in which such a pin photodiode and an electronic circuit device are monolithically integrated on a semiconductor substrate is disclosed in U.S. patent application Ser. No. 08/203,921.

Figure 7:
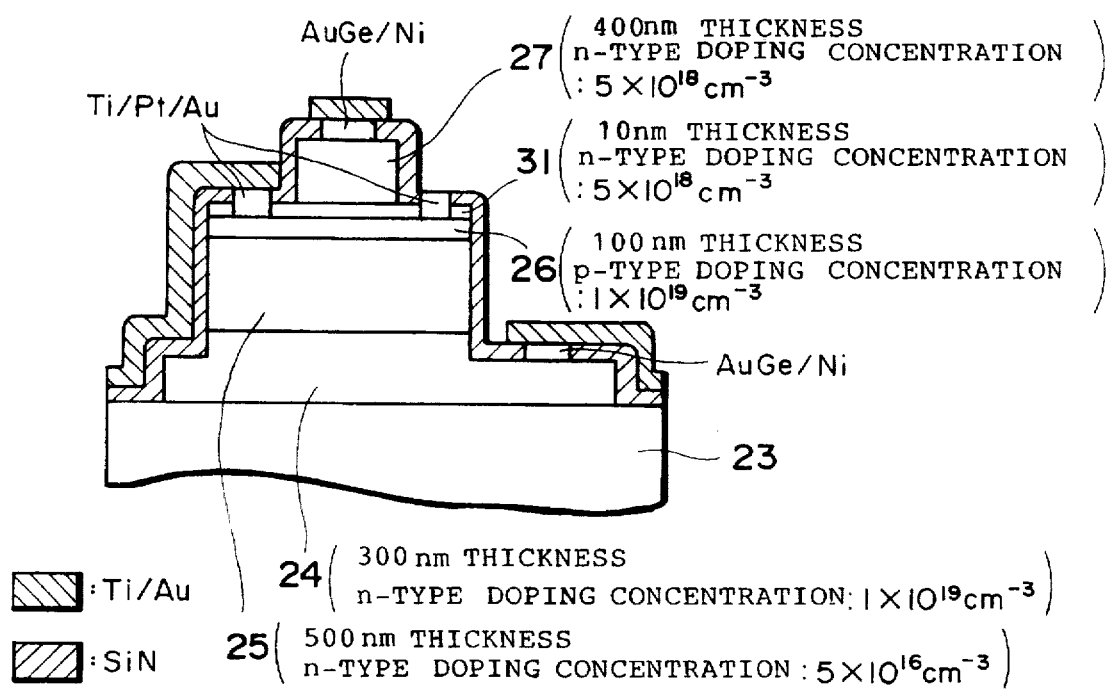
FIG. 7 is a sectional view showing the detailed structure of an HBT of the embodiment.
Figure 8:
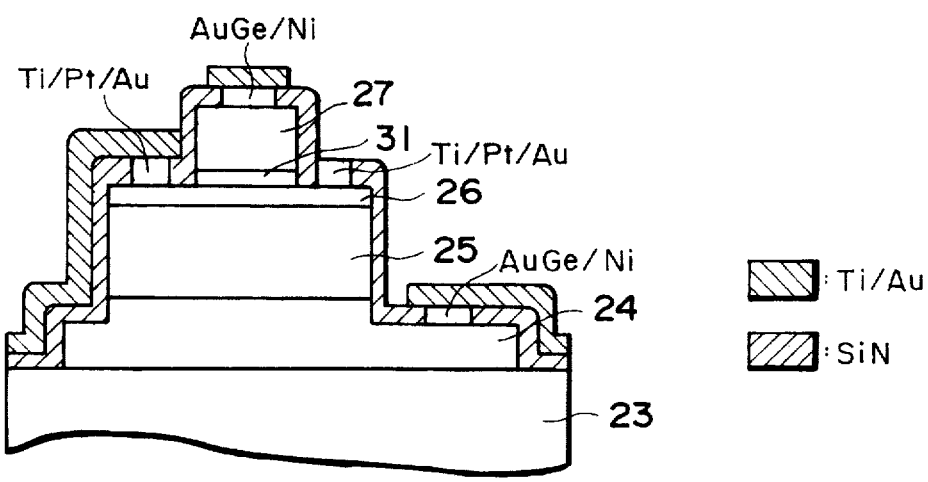
FIG. 8 is a sectional view showing the detailed structure of an HBT of the embodiment.

FIG. 7 and FIG. 8 show the detailed structure of the HBT 21. FIG. 7 is a first example of HBTs which can be used in the present embodiment. In this HBT, as shown in FIG. 7, a sub-collector layer 24 has a thickness of 300 nm and an n-type doping concentration of $1 \times 10^{19}$ cm$^{-3}$. A collector layer 25 has a thickness of 500 nm and an n-type doping concentration of $5 \times 10^{16}$ cm$^{-3}$. A base layer 26 has a thickness of 100 nm and a p-type doping concentration of $1 \times 10^{-19}$ cm$^{-3}$. An emitter layer 31 has a thickness of 10 nm and an n-type doping concentration of $5 \times 10^{18}$ cm$^{-3}$. An emitter-contact layer 27 has a thickness of 400 nm and an n-type doping concentration of $5 \times 10^{18}$ cm$^{-3}$. SiN is used for the insulating layer, and Ti/Au is used for the wiring. The emitter and collector electrodes and the base electrode are made of AuGe/Ni and Ti/Pt/Au, respectively. The emitter layer 31 is formed on the entire upper surface of the base layer 26, not only a region (intrinsic region) on which the emitter contact layer 27 is formed. The emitter layer 31 has a thin thickness of 10 nm, so that it is depleted under normal operation. FIG. 8 is a second example of HBTs which can be used in the present embodiment. The composition of each layer and the material of each electrode are the same as those of the HBT shown in FIG. 7. As shown in FIG. 8, an emitter layer 31 is formed only on the intrinsic region. The HBTs shown FIG. 7 and FIG. 8 operate excellently as transistors used in the optical link apparatus.

Figure 9:
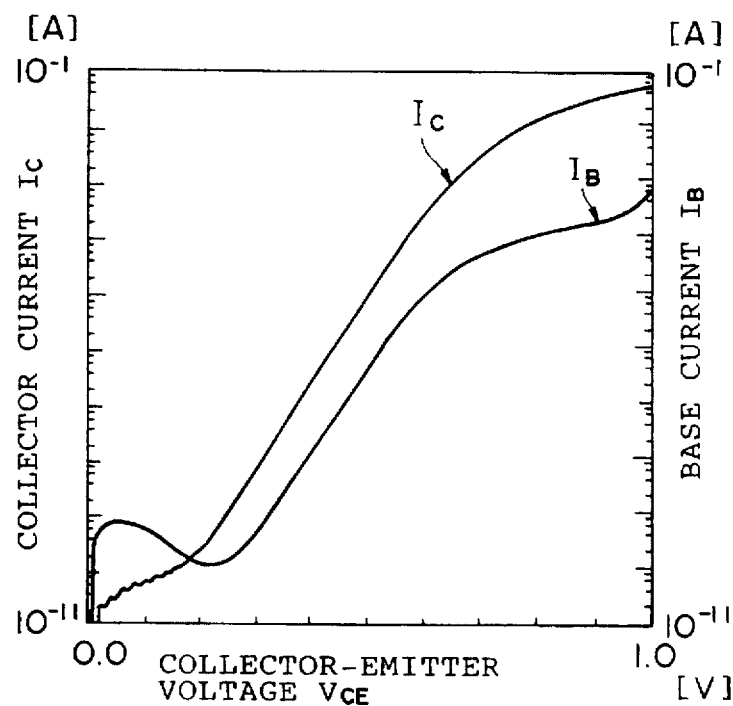
FIG. 9 is a graph showing operational characteristics of an HBT.
Figure 10:
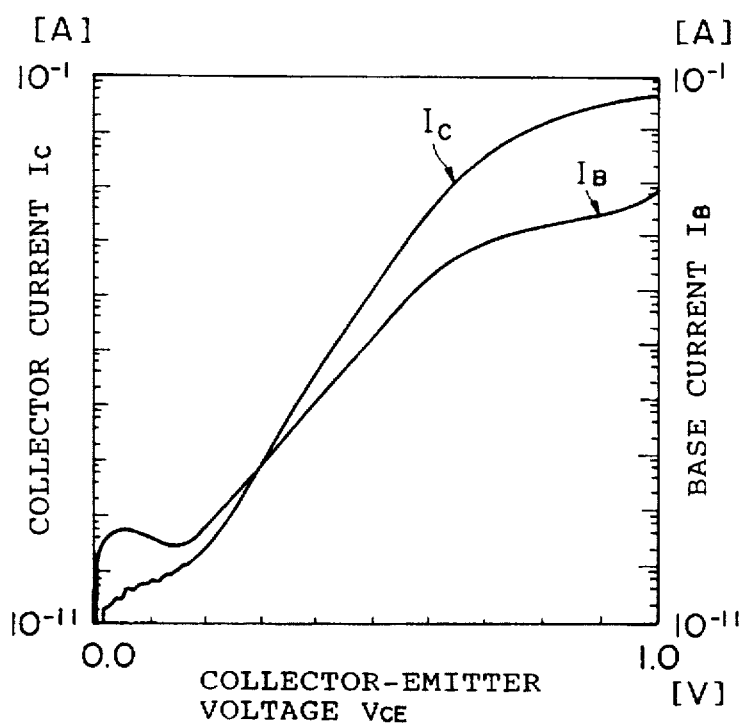
FIG. 10 is a graph showing operational characteristics of an HBT.

FIG. 9 and FIG. 10 are graphs showing the collector current $I_C$ and the base current $I_B$ when the collector-emitter voltage and the base-emitter voltage are the same voltage ($V_{CE}$). FIG. 9 and FIG. 10 correspond to FIG. 7 and FIG. 8, respectively. As the two graphs in FIG. 9 and FIG. 10 are compared, it can be understood that the base current of the HBT of FIG. 7 is smaller than that of the HBT of FIG. 8. That is, the base leakage current of the HBT of FIG. 7 is small as compared with that of the HBT of FIG. 8. Consequently, the characteristics of the optical link apparatus are further improved with use of the HBT of FIG. 7.

Figure 11:
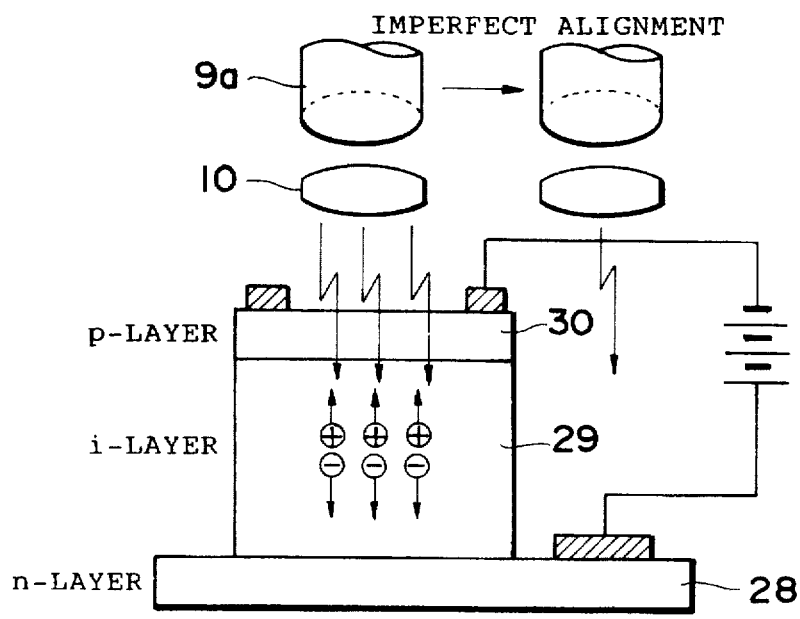
FIG. 11 is a view showing a process of aligning with a pin photodiode.
Figure 12:
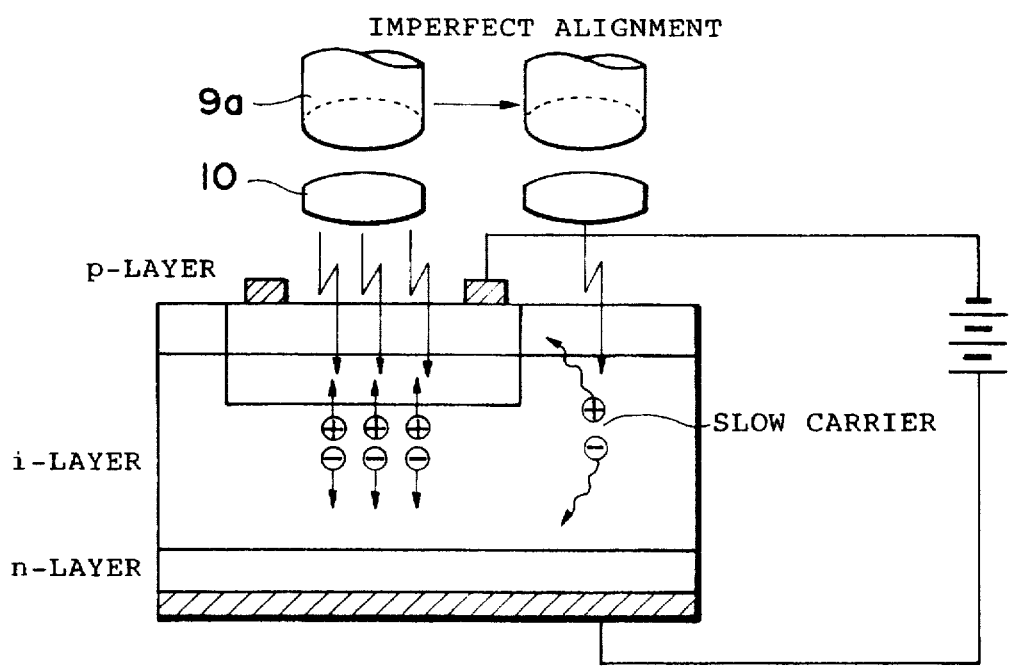
FIG. 12 is a view showing a process of aligning with a pin photodiode.

Further, in the above embodiment, the pin photodiode is formed into a mesa shape. With the mesa pin photodiode, an alignment process in the optical link apparatus manufacture can be made easier. FIG. 11 shows a mesa pin photodiode, and FIG. 12 shows a planer pin photodiode. A p-layer is formed by impurity diffusion or ion implantation. As shown in FIG. 12, in the case of the planer pin photodiode, the absorption region cannot be limited to the region underneath the light receiving region. Consequently, while the optical fiber 9a is aligned, carriers (slow carriers) generate upon light incident almost perpendicularly on the region other than the light receiving region (see FIG. 12). On the other hand, in the case of the mesa pin photodiode, owing to the structure, the absorption region can be limited to the region underneath the light receiving region, so that carriers do not generate, upon light incident almost perpendicularly on the region other than the light receiving region (see FIG. 11). Therefore, in the case that the alignment is performed by measuring the generated current signal, with use of the mesa pin photodiode, the alignment with the optical fiber can be made easier, and the productivity of the optical link apparatus is improved.

Figure 13:
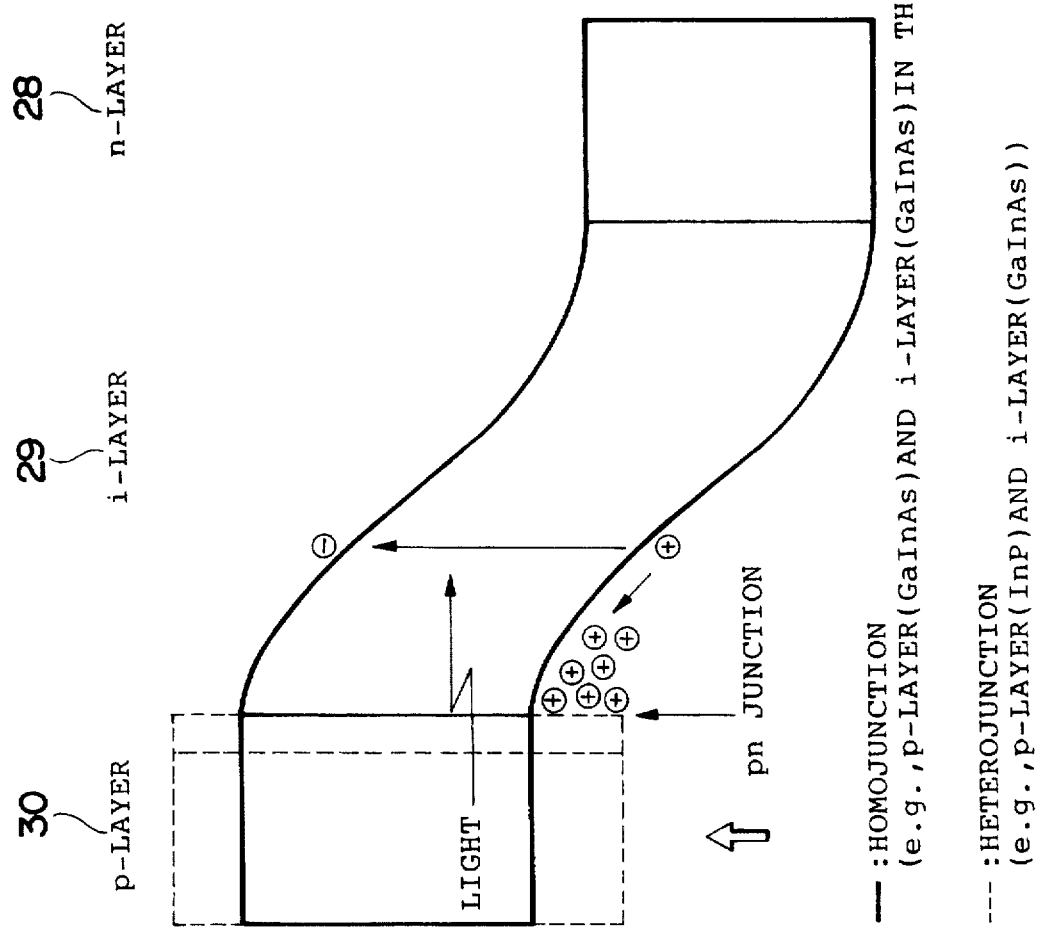
FIG. 13 is a band diagram of a pin photodiode.

FIG. 13 is the band diagram of the pin photodiode 22. As shown in FIG. 13, in the band structure of the pin photodiode 22, the pn junction is homo junction. The carrier accumulation, which occurs in the case that the pn junction is the heterojunction, does not occur. The heterojunction is preferably not presented in the pn junction and its vicinity because the carrier accumulation also occurs in the case that the heterojunction is presented in the vicinity of the pn junction.

Figure 14:
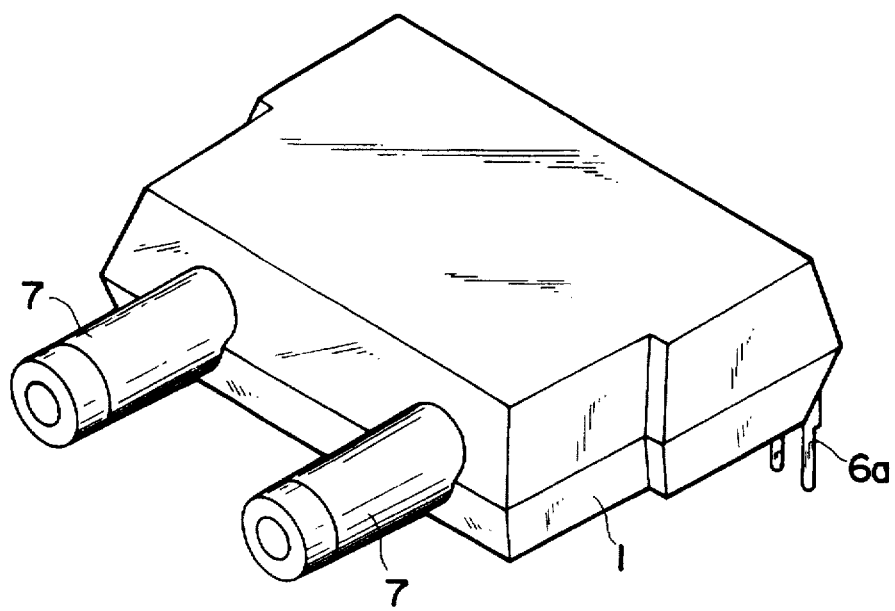
FIG. 14 is a perspective view showing an appearance of an optical link apparatus of the embodiment according to the present invention.

The hybrid ICs 2 and 3, the lead pins 6a, the light receiving device unit 4, the light transmitting device unit 5, the sleeves 7 and the others are set in a mold for a transfer molding. Next, a resin is injected into a mold cavity to form the plastic molding 1 in which the light receiving device unit, the light emitting device unit, the sleeves and others are integrally contained (see FIG. 14).

Next, the operation of the optical link apparatus of the above embodiment will be explained.

Conventionally, the preamplifier of the light receiving unit is mounted on the island 6b of the lead frame. However, in this embodiment, the preamplifier together with the pin photodiode is integrated on the indium phosphide substrate, which is an OEIC, so that the area of the island 6b can be made smaller. Further, the main amplifier of the receiver circuit, which is conventionally formed by mounting the electronic components on the island 6b, is integrated and mounted on the island 6b, so that the area of the island 6b can be made smaller. Therefore, the area of the lead frame becomes very small.

Figure 15:
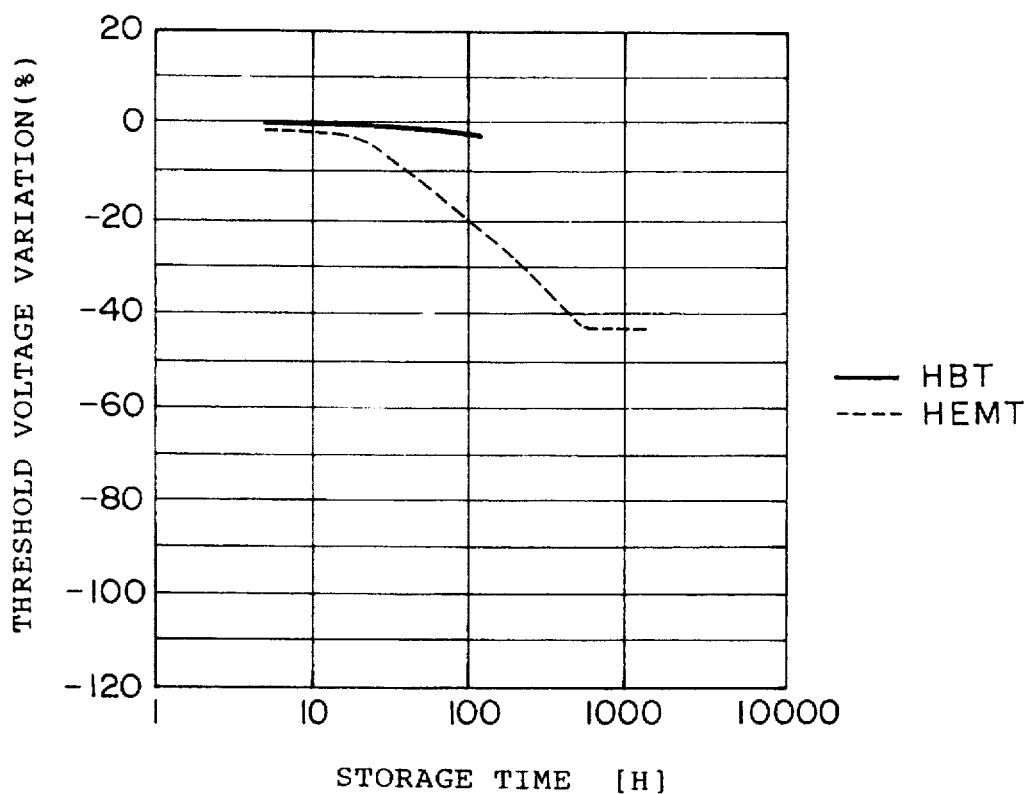
FIG. 15 is a graph showing the threshold voltage variation of an HBT and an HEMT.

A heterojunction bipolar transistor and a pin photodiode are used as a transistor and a light receiving device in the OEIC 20, respectively which is used in the optical link apparatus of the embodiment. This is because their characteristics are thermally stable. The threshold voltage variation of the HEMT and HBT is shown in FIG. 15. Both devices were kept at 200° C., and the HBT was stored while being electrically excited. It is understand that the HBT is thermally stable as compared with the HEMT shown as a solid line in FIG. 15.

In the case that the OEIC in which an HEMT was used was molded with a plastic, the transistor characteristics were degraded in a process of evaporating a solvent after a plastic molding process since the optical link apparatus was heated at about 180° C. for eight hours. A 3 dB bandwidth of the transimpedance was sharply degraded from 560 MHz to 190 MHz. However, in the optical link apparatus of the present invention, the HBT the heat characteristic of which is stable as shown in FIG. 15 is used, so that the characteristics of the optical link apparatus are not degraded. In the optical link apparatus of the present embodiment, a 3 dB bandwidth of the transimpedance was slightly varied from 270 MHz to 250 MHz, but the characteristic degradation due to the plastic molding process did not occur.

Accordingly, the optical link apparatus of the embodiment comprising the optical receiver and the optical transmitter is an optical link apparatus which is small and superior in productivity and processability.

The present invention is not limited to the above embodiment, but various modifications can be made.

For example, the optical link apparatus can comprise only a light receiving unit or a light transmitting unit. Further, a light emitting device and bipolar transistors constituting a transmitter circuit can be monolithically integrated. Furthermore, in the above embodiment, the main amplifier of the receiver circuit and the transmitter circuit are fabricated in the hybrid ICs, but the electronic components can be mounted on the island of the lead frame although the area of the island becomes large. In this case, the light receiving device and the preamplifier are still monolithically integrated, so that the optical link apparatus can be made smaller than the conventional optical link apparatus.

Thus, according to the optical link apparatus of the present invention, an optoelectronic integrated circuit in which a light receiving device or a light emitting device, and a bipolar transistor, which constitute a circuit, are monolithically integrated is molded by a plastic molding which is superior in productivity and processability, so that the optical link apparatus which is small and superior in productivity can be achieved.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.191425/1993 filed on Aug. 2, 1993 is hereby incorporated by reference.

What is claimed is:

1. An optical link apparatus comprising a link unit to be coupled to an optical fiber Cable, a light receiving device for converting an optical Signal entered from said optical fiber into an electrical signal, and a receiver circuit for processing the electrical signal from said light receiving device, said optical link apparatus being integrally molded with a plastic so that one end of said link unit is exposed to the outside;

wherein said light receiving device, and a bipolar transistor constituting at least a part of said receiver circuit are monolithically integrated on a semiconductor substrate and installed at one end of said optical link unit.

2. An optical link apparatus according to claim 1, wherein said semiconductor substrate is made of InP.

3. An optical link apparatus according to claim 1, wherein said bipolar transistor is a heterojunction bipolar transistor.

4. An optical link apparatus according to claim 3, wherein said heterojunction bipolar transistor comprises a collector portion comprising a first semiconductor layer formed on said substrate and having a first conduction type, and a first electrode formed on a surface of said first semiconductor layer, a base portion comprising a second semiconductor layer formed on said collector portion and having a second conduction type, and a second electrode formed on a surface of said second semiconductor layer, and an emitter portion comprising a third semiconductor layer formed on a surface of said base portion opposing to a junction between said base portion and said collector portion and having the first conduction type;

a part of said third semiconductor layer on a first region of a surface of said base portion has a first thickness; and said third semiconductor layer on a second region of the surface region of said base portion, except said first region and the second electrode formed region, has a thickness so as to be depleted under normal operation.

5. An optical link apparatus according to claim 1, wherein said light receiving device is a pin photodiode.

6. An optical link apparatus according to claim 5, wherein said pin photodiode comprises semiconductor layers deposited on said substrate into a mesa shape.

7. An optical link apparatus according to claim 5, wherein pn junction of said pin photodiode is homojunction; and heterojunction is not presented in the vicinity of the pn junction.

8. An optical link apparatus according to claim 1 further comprising a transmitter comprising a link unit to be coupled to an optical fiber cable, a light emitting device for emitting an optical signal to said fiber cable, and a transmitter circuit for driving said light emitting device;

wherein said light emitting device, and a bipolar transistor constituting at least a part of said transmitter circuit are monolithically integrated with a semiconductor substrate.

9. An optical link apparatus comprising a link unit to be coupled to an optical fiber cable, a light emitting device for emitting an optical signal to said optical fiber cable, and a transmitter circuit for driving said light emitting device, said optical link apparatus being integrally molded with a plastic so that one end of said link unit is exposed to the outside;

wherein said light emitting device, and a bipolar transistor constituting at least a part of said transmitter circuit are monolithically integrated on a semiconductor substrate and installed at one end of said optical link unit.

10. An optical link apparatus according to claim 9, wherein said semiconductor substrate is made of InP.

11. An optical link apparatus according to claim 9, wherein said bipolar transistor is a heterojunction bipolar transistor.

12. An optical link apparatus according to claim 11, wherein said heterojunction bipolar transistor comprises a collector portion comprising a first semiconductor layer formed on said substrate and having a first conduction type, and a first electrode formed on a surface of said first semiconductor layer, a base portion comprising a second semiconductor layer formed on said collector portion and having a second conduction type, and a second electrode formed on a surface of said second semiconductor layer, and an emitter portion comprising a third semiconductor layer formed on a surface of said base portion opposing to a junction surface between said base portion and said collector portion and having the first conduction type;

a part of said third semiconductor layer on a first region of a surface of said base portion has a first thickness; and said third semiconductor layer on a second region of the surface region of said base portion, except said first region and the second electrode formed region, has a thickness so as to be depleted under normal operation.

13. An optical link apparatus according to claim 9 further comprising a receiver comprising a link unit to be coupled to an optical fiber cable, a light receiving device for converting an optical signal entered from said optical fiber into an electrical signal, and a receiver circuit for processing the electrical signal from said light receiving device;

wherein said light receiving device, and a bipolar transistor constituting at least a part of said receiver circuit are monolithically integrated with a semiconductor substrate.

* * * * *